US010763386B2

(12) United States Patent
Fogel et al.

(10) Patent No.: US 10,763,386 B2
(45) Date of Patent: Sep. 1, 2020

(54) HETEROSTRUCTURE GERMANIUM TANDEM JUNCTION SOLAR CELL

(71) Applicant: International Business Machines Corporation, Armonk, NY (US)

(72) Inventors: Keith E. Fogel, Hopewell Junction, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 109 days.

(21) Appl. No.: 16/034,589

(22) Filed: Jul. 13, 2018

(65) Prior Publication Data

US 2018/0323330 A1 Nov. 8, 2018

Related U.S. Application Data

(62) Division of application No. 15/178,701, filed on Jun. 10, 2016, now Pat. No. 10,283,663, which is a
(Continued)

(51) Int. Cl.
*H01L 31/105* (2006.01)
*H01L 31/078* (2012.01)
(Continued)

(52) U.S. Cl.
CPC .... *H01L 31/078* (2013.01); *H01L 31/035227* (2013.01); *H01L 31/035281* (2013.01);
(Continued)

(58) Field of Classification Search
CPC ......... H01L 31/035227; H01L 31/0745; H01L 31/0747; H01L 31/076; H01L 31/078
See application file for complete search history.

(56) References Cited

U.S. PATENT DOCUMENTS

| 4,496,788 A | 1/1985 | Hamakawa et al. |
| 4,666,569 A | 5/1987 | Basol |
(Continued)

FOREIGN PATENT DOCUMENTS

CN 1910759 A 2/2007

OTHER PUBLICATIONS

Band Structure and Carrier Concentration of Germanium; http://www.ioffe.ru/SVA/NSM/Semicond/Ge/bandstr.html; accessed and printed 2019 (Year: 2019).*
Chinese Office Action dated May 12, 2016 received in Chinese Patent Application No. 201310356176.6.
Semiconductor Band Gaps; hyperphysics; http://hyperphysics.phy-astr.gsu.edu/hbase/tables/semgap.html; (2 pages) accessed Jan. 21, 2015.
(Continued)

*Primary Examiner* — Edward J. Schmiedel
(74) *Attorney, Agent, or Firm* — Scully, Scott, Murphy & Presser, P.C.; L. Jeffrey Kelly, Esq.

(57) ABSTRACT

A photovoltaic device that includes an upper cell that absorbs a first range of wavelengths of light and a bottom cell that absorbs a second range of wavelengths of light. The bottom cell includes a heterojunction comprising a crystalline germanium containing (Ge) layer. At least one surface of the crystalline germanium (Ge) containing layer is in contact with a silicon (Si) containing layer having a larger band gap than the crystalline (Ge) containing layer.

17 Claims, 4 Drawing Sheets

Related U.S. Application Data division of application No. 13/586,138, filed on Aug. 15, 2012, now Pat. No. 9,373,741.

(51) Int. Cl.
 H01L 31/0725 (2012.01)
 H01L 31/0352 (2006.01)
 H01L 31/0745 (2012.01)
 H01L 31/076 (2012.01)
 H01L 31/18 (2006.01)
 H01L 31/20 (2006.01)

(52) U.S. Cl.
 CPC ........ H01L 31/076 (2013.01); H01L 31/0725 (2013.01); H01L 31/0745 (2013.01); H01L 31/1824 (2013.01); H01L 31/1884 (2013.01); H01L 31/20 (2013.01); Y02E 10/548 (2013.01)

(56) References Cited

U.S. PATENT DOCUMENTS

| | | | |
|---|---|---|---|
| 6,166,319 | A | 12/2000 | Matsuyama |
| 6,180,870 | B1 | 1/2001 | Sano et al. |
| 8,003,883 | B2 | 8/2011 | Korevaar et al. |
| 8,912,424 | B2 | 12/2014 | Bedell et al. |
| 9,349,905 | B2 | 5/2016 | Woods et al. |
| 9,373,741 | B2 | 6/2016 | Fogel et al. |
| 2008/0169019 | A1 | 7/2008 | Korevaar et al. |
| 2010/0059111 | A1 | 3/2010 | Shin et al. |
| 2010/0084013 | A1 | 4/2010 | Eo et al. |
| 2010/0175748 | A1 | 7/2010 | Karg |
| 2012/0097232 | A1 | 4/2012 | Kim et al. |
| 2014/0048122 | A1 | 2/2014 | Fogel et al. |
| 2016/0284926 | A1 | 9/2016 | Fogel et al. |

OTHER PUBLICATIONS

Flamand G. et al, "Towards Highly Efficient 4-Terminal Mechanical Photovoltaic Stacks", III-Vs Review 19 (7):24-27 (Sep. 2006).

Gu A. et al, "Design and Growth of III-V Nanowire Solar Cell Arrays on Low Cost Substrates", Photovoltaic Specialists Conference (PVSC), 35th IEEE (4 pages) (Jun. 2010).

Karam N. H. et al, "Recent Developments in High-Efficiency Ga0.5In0.5P/GaAs/Ge Dual- and Triple-Junction Solar Cells: Steps to Next-Generation PV Cells", Solar Energy Materials & Solar Cells 66:453-466 (2001).

Krut D.D. et al., "The Development of Ge Bottom Cell for Monolithic and Stacked Multi-Junction Applications", Conference Record of the Twenty Second IEEE, 1:90-92 (Oct. 1991).

Posthuma N.E. et al., "Development of Stand-Alone Germanium Solar Cells for Application in Space Using Spin-On Diffusants", 3rd World Conference on Photovoltaic Energy Conversion, pp. 777-780 (May 2003).

Posthuma N.E. et al., "Emitter Formation and Contact Realization by Diffusion for Germanium Photovoltaic Devices", IEEE Transactions on Electron Devices 54(5):1210-1215 (May 2007).

Timo G. et al, "Bottom Cell Growth Aspects for Triple Junction InGaP/(In)GaAs/Ge Solar Cells", Cryst. Res. Technol. 40(10-11):1043-1047 (Nov. 2005).

Tutuc E. et al, "Realization of a Linear Germanium Nanowire p-n Junction", Nano Letters 6(9):2070-2074 (2006).

Van Der Heide J. et al., "Development of Low-Cost Thermophotovoltaic Cells Using Germanium Substrates", Seventh World Conference on Thermophotovoltaic Generation of Electricity AIP Conference Proceedings 890:129-138 (Sep. 2006).

Yun J-H et al, "Solution-Processed Germanium Nanowire-Positioned Schottky Solar Cells", Nanoscale Research Letters 6:287 (2011).

\* cited by examiner

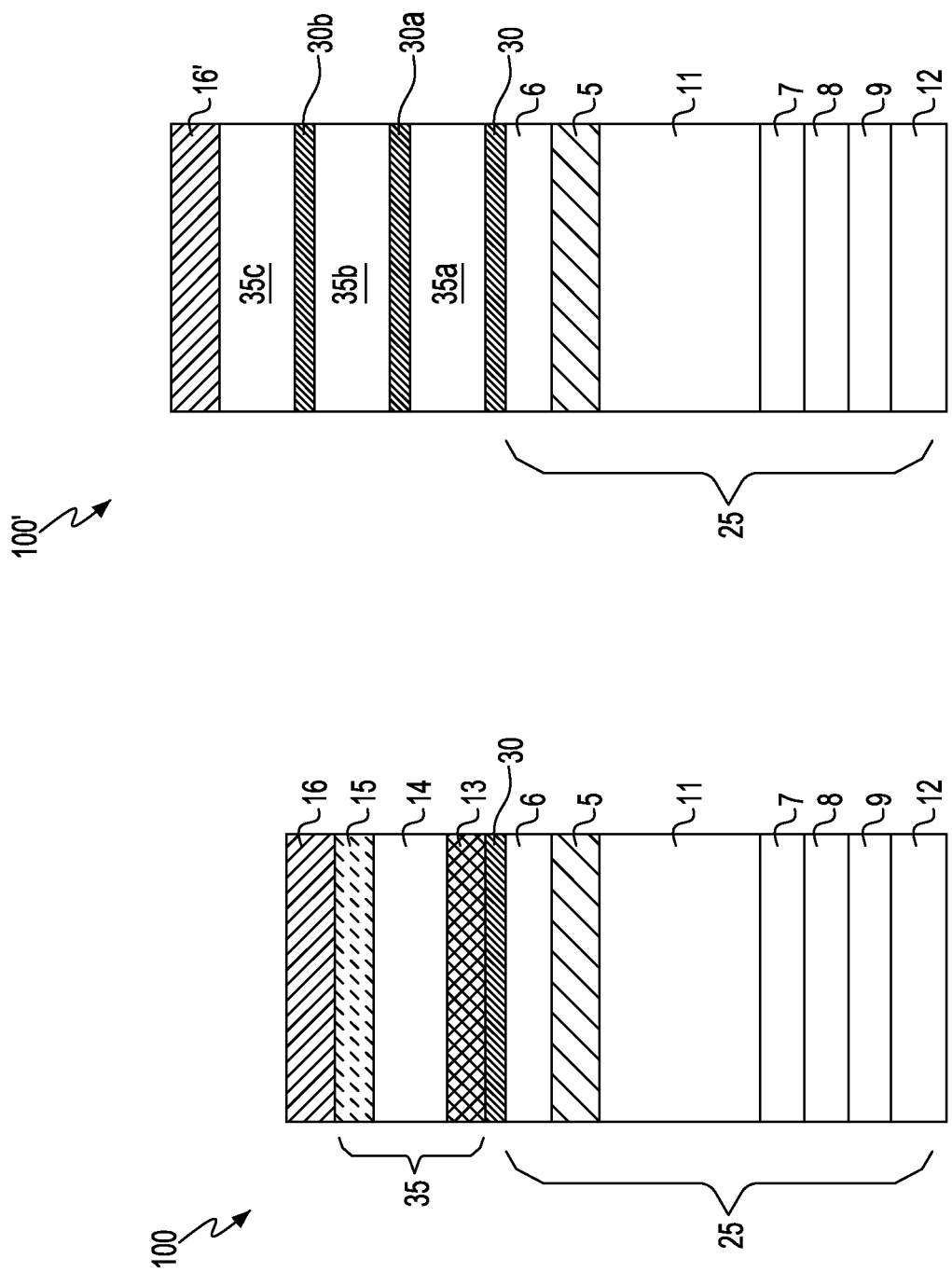

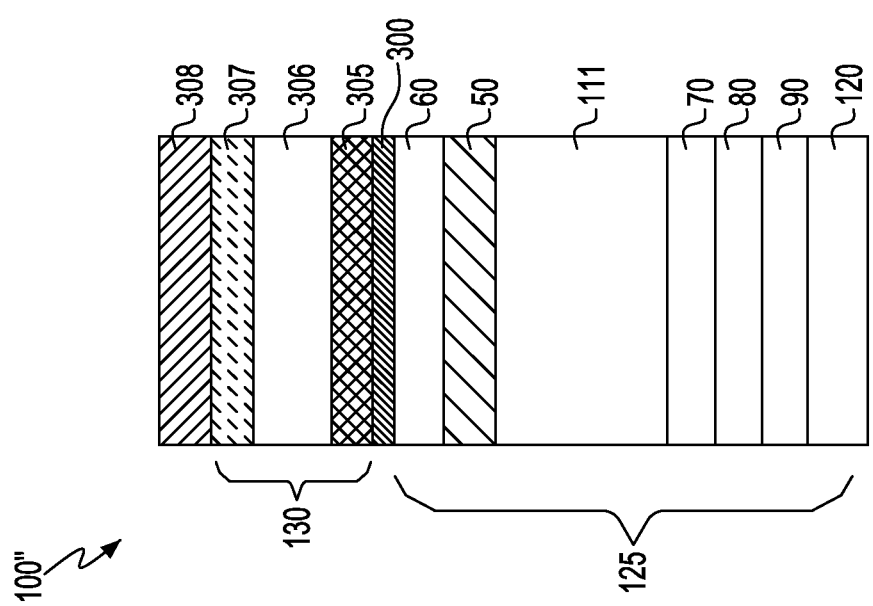

HETEROSTRUCTURE GERMANIUM TANDEM JUNCTION SOLAR CELL

BACKGROUND

The present disclosure relates to photovoltaic devices, and more particularly to photovoltaic devices such as, for example, solar cells.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hν, in which the energy E is equal to the product of the Plank constant h and the frequency ν of the electromagnetic radiation associated with the photon.

BRIEF SUMMARY

In one embodiment, a photovoltaic device is provided that includes an upper cell that absorbs a first range of wavelengths of light and a bottom cell that absorbs a second range of wavelengths of light. The bottom cell includes a heterojunction including a crystalline germanium containing (Ge) layer. At least one surface of the crystalline germanium (Ge) containing layer is in contact with a silicon (Si) containing layer having a larger band gap than the crystalline (Ge) containing layer.

In another aspect, a method of forming a photovoltaic device is provided that includes forming a first cell comprising a crystalline germanium (Ge) containing layer. The crystalline germanium (Ge) containing layer of the first cell includes at least one surface that is in contact with a silicon (Si) containing layer. The silicon (Si) containing layer typically has a larger band gap than the crystalline germanium (Ge) containing layer. In one embodiment, the method forming at least a second cell on the first cell, wherein the second cell is positioned so that a light enters the second cell before reaching the first cell.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which:

FIG. 1B is a side cross-sectional view across section line B-B of the photovoltaic device that is depicted in FIG. 1A in which the upper cell is a single p-i-n solar cell comprised of amorphous hydrogenated silicon (Si), in accordance with one embodiment of the present disclosure.

FIG. 1C is a side cross-sectional view across section line B-B of the photovoltaic device that is depicted in FIG. 1A, in which the upper cell comprises a first p-i-n solar cell comprised of hydrogenated microcrystalline silicon, a second p-i-n solar cell comprised of hydrogenated amorphous silicon germanium (SiGe), and a third p-i-n solar cell comprised of hydrogenated amorphous silicon (Si), in accordance with one embodiment of the present disclosure.

FIG. 2B is a side cross-sectional view across section line B-B of the photovoltaic device that is depicted in FIG. 2A, in accordance with one embodiment of the present disclosure.

DETAILED DESCRIPTION

Figure 1A:
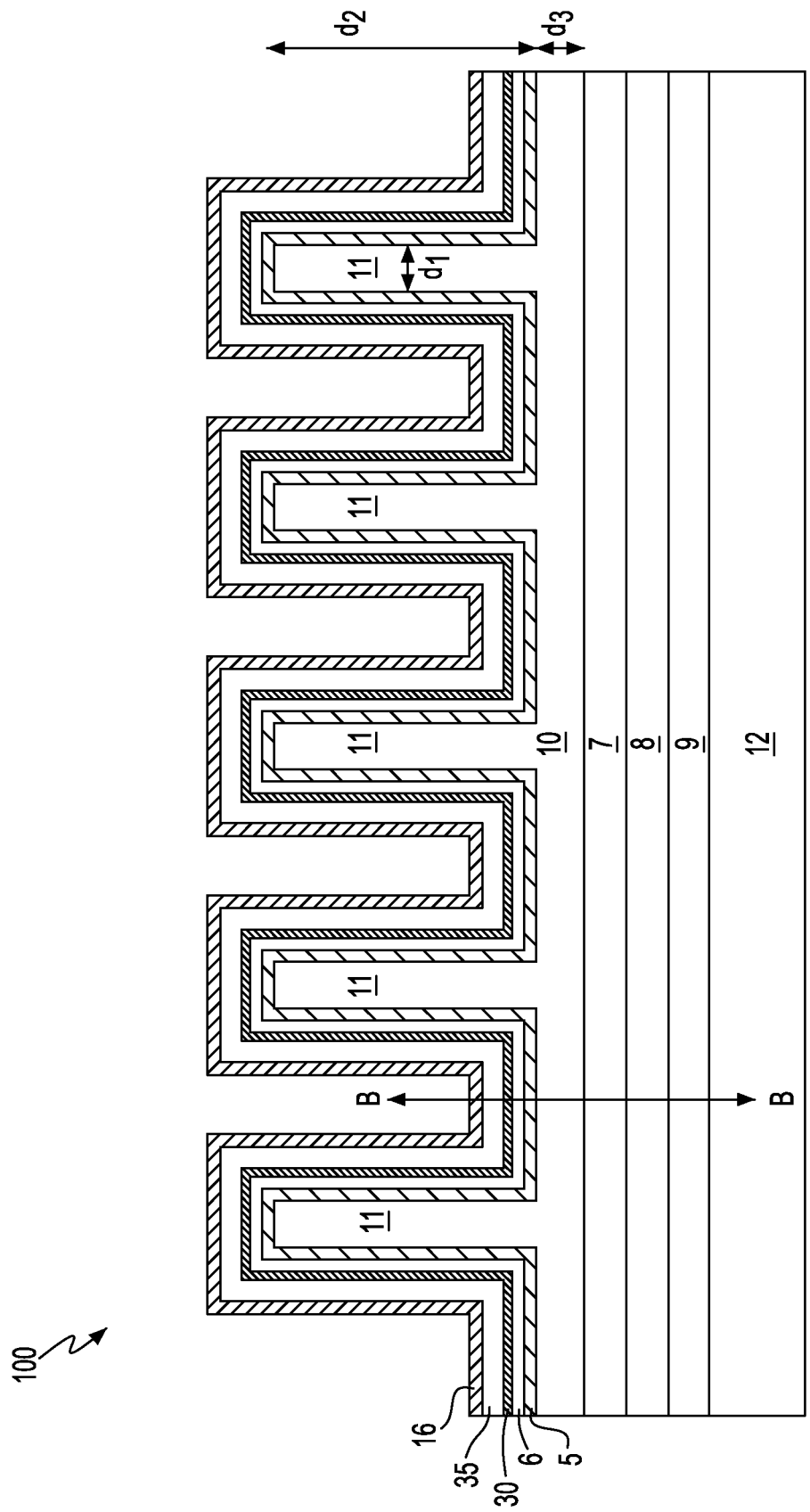
FIG. 1A is a side cross-sectional view of a photovoltaic device including at least one silicon (Si) containing upper cell and a germanium (Ge) containing bottom cell, in which the bottom cell includes a heterojunction of a crystalline germanium containing (Ge) nanowire and a silicon (Si) containing layer, in accordance with one embodiment of the present disclosure.

Detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Further, the figures are not necessarily to scale, some features may be exaggerated to show details of particular components. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "vertical", "horizontal", "top", "bottom", and derivatives thereof shall relate to the structures disclosed herein, as they are oriented in the drawing figures.

The term "direct contact" means that a first element, such as a first structure, and a second element, such as a second structure, are connected without and intermediate conducting, insulating or semiconductor layers at the interface of the two elements. The terms "overlying", "atop", "positioned on" or "positioned atop" means that a first element, such as a first structure, and a second element, such as a second structure, are connected without any intermediary conducting, insulating or semiconductor layers at the interface of the two elements.

In some embodiments, tandem-junction solar cells allow for efficient collection of the solar spectrum, and may therefore be beneficial for high conversion efficiencies. Some examples of multiple-junction solar cells include a cell stack of hydrogenated amorphous silicon carbide (α-SiC:H)/hydrogenated amorphous silicon (α-Si:H)/hydrogenated amorphous silicon germanium (α-SiGe:H) or a cell stack of hydrogenated amorphous silicon (α-Si:H)/hydrogenated amorphous silicon germanium (α-SiGe:H)/hydrogenated microcrystalline silicon (μμc-Si:H). However, the bandgap of the hydrogenated amorphous silicon germanium (α-SiGe:H) or the hydrogenated microcrystalline silicon (μμc-Si:H) utilized as the bottom cell material of the aforementioned cell stacks has a lower limit with the range of 1.0 eV to 1.1 eV. Photovoltaic devices that require lower bandgaps may require crystalline germanium (c-Ge) substrates or high-quality thick (at least few microns) polycrystalline germanium (poly-Ge) layers both of which are expensive and can defy the purpose of low-cost large-area processing intended by plasma enhanced chemical vapor deposition (PECVD) growth of hydrogenated thin films.

In some embodiments, the structures and methods disclosed herein provide a heterojunction germanium (Ge) containing bottom cell, in which a silicon (Si) containing layer having a larger bandgap is in contact with the crystalline germanium (Ge) containing layer of the heterojunction germanium (Ge) containing bottom cell, and the silicon (Si) containing layer has an opposite conductivity type as the crystalline germanium (Ge) containing layer. The crystalline germanium (Ge) containing layer of the heterojunction germanium (Ge) containing bottom cell may have a nanowire geometry. In some embodiments, the heterojunction emitter and back contacts of the bottom cells may be deposited at low temperatures less than 400° C. by plasma enhanced chemical vapor deposition (PECVD). In some embodiments, the nanowire structure of the crystalline germanium (Ge) containing layer of the bottom cell allows for efficient light trapping by reducing reflection. In addition, the radial collection of carriers in the nanowire (while light absorption is vertical) allows for efficient collection of carriers in Ge material with moderate or poor lifetime allowing the use of poly crystalline germanium (poly-Ge) instead of crystalline germanium (c-Ge).

FIGS. 1A and 1B depict one embodiment of a photovoltaic device 100 including a silicon (Si) containing upper cell 35 (also referred to as a second cell) and a germanium (Ge) containing bottom cell 25 (also referred to as a first cell). The upper cell 35 absorbs a first range of wavelengths of light and the bottom cell 25 absorbs a second range of wavelengths of light. In a typical semiconductor, the vast majority of the incident photons having energies smaller than the bandgap of the semiconductor are not absorbed in the semiconductor. In contrast, a significant portion of photons with energies larger than that of the bandgap may be absorbed and converted to electron-hole pairs. The portion of the photon energy consumed for electron-hole generation is close to the bandgap energy of the semiconductor, while the excess photon energy (approximately equal to the difference between the photon energy and the bandgap energy) is dissipated as heat. Therefore, the conversion of light into electricity is typically most efficient for photons having energies close to that of the bandgap energy where energy loss by heat dissipation is minimum. Therefore the combination of a wide gap top cell 35 and a narrow gap bottom cell 30 may allow for a more efficient conversion of sunlight compared to a single cell, by allowing a relatively more efficient conversion of photons with higher energies in the top cell 35 (which would be otherwise less efficiently converted in the bottom cell 30 due to a high thermal loss), and a relatively more efficient conversion of photons with lower energies (the majority of which are not absorbed in the top cell 35) in the bottom cell 30. In one example, the materials of at least the second solar cell 35 are selected to have a bandgap in the range of 0.85 eV-1.12 eV, and the materials of the first solar cell 30 are selected to have a bandgap in the range of 0.67 eV-1.0 eV. In another example, the materials of at least the second solar cell 35 are selected to have a bandgap in the range of 0.95 eV-1.12 eV, and the materials of the first solar cell 30 are selected to have a bandgap in the range of 0.67 eV-0.8 eV. The energy of a photon (hv) and the wavelength of a photon ($\lambda$) are related through the relation $hv = hc/\lambda$, where h is the Plank's constant, and c is the speed of light (the value of hc is approximately equal to 1239 eV/nm). For example, the energy of a photon of a wavelength of 450 nm is approximately 2.8 eV. As used herein, a "photovoltaic device" is a device, such as a solar cell, that produces free electrons-hole pairs, when exposed to radiation, such as light, and results in the production of an electric current. The photovoltaic device typically includes layers of p-type conductivity and n-type conductivity that share an interface to provide a junction. The "absorption layer" of the photovoltaic device is the material that readily absorbs photons to generate charge carriers, i.e., free electrons or holes. A portion of the photovoltaic device, between the front side and the junction is referred to as the "emitter layer", and the junction is referred to as the "emitter junction". The emitter layer may be present atop the absorption layer, in which the emitter layer has a conductivity type that is opposite the conductivity type as the absorption layer. In one example, when the Sun's energy in the form of photons collects in the cell layers, electron-hole pairs are generated in the material within the photovoltaic device. The emitter junction provides the required electric field for the collection of the photo-generated holes and electrons on the p-doped and n-doped sides of the emitter junction, respectively. For this reason, and in this example, at least one p-type layer of the photovoltaic device may provide the absorption layer, and at least one adjacent n-type layer may provide the emitter layer.

In some embodiments, at least a portion of the absorption layer for the bottom cell 25 is provided by the crystalline germanium (Ge) containing layer 10. By "crystalline" it is meant that the crystalline germanium (Ge) containing layer 10 may have either a single crystal crystalline structure, a polycrystalline crystal structure or a multi-crystalline crystal structure. In some embodiments, the crystalline germanium (Ge) containing layer 10 may include multiple germanium (Ge) containing layers of single crystal crystalline structure materials and polycrystalline crystal structure materials. In one embodiment, the crystalline germanium (Ge) containing layer 10 may have a single crystal crystalline structure. The term "single crystal crystalline structure" denotes a crystalline solid, in which the crystal lattice of the entire sample is substantially continuous and substantially unbroken to the edges of the sample, with substantially no grain boundaries. In another embodiment, the crystalline semiconductor material of the absorption crystalline germanium (Ge) containing layer 10 is of a multi-crystalline or polycrystalline structure. Contrary to a single crystal crystalline structure, a polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns).

In some embodiments, in which the crystalline germanium (Ge) containing layer 10 provides the absorption layer of the bottom cell 25, the crystalline geranium (Ge) containing layer 10 may have a band gap that ranges from 0.67 eV to 1.0 eV. In another embodiment, the crystalline germanium (Ge) containing layer 10 has a band gap that ranges from 0.67 eV to 0.8 eV.

At least one surface of the crystalline germanium (Ge) containing layer 10 is in contact with a silicon (Si) containing layer 5 having a larger band gap than the crystalline (Ge) containing layer 10, in which the silicon (Si) containing layer 5 is a component of the emitter contact to the bottom cell 25, i.e., first cell. The term "band gap" as used herein means the difference in energy in a substance between electron orbitals in which the electrons are not free to move, i.e., the valence band, and orbitals in which they are relatively free and will carry a current, i.e., the conduction band. To provide a smaller band gap in the crystalline (Ge) containing layer 10 that provides the absorption layer of the bottom cell 25 (also referred to as first cell), the silicon (Si) content in the germanium (Ge) containing layer 10 is selected to be less than the silicon (Si) content of the silicon-containing layer 5. In some instances, when the silicon containing layer 5 is composed of silicon germanium (SiGe), the crystalline germanium (Ge) containing layer 10 may be substantially pure germanium (Ge). By "substantially pure" it is meant that the crystalline germanium (Ge) containing layer 10 may be composed of a base material that is 99 at. % germanium (Ge) or greater, e.g., 100 at. % germanium (Ge). The term "substantially pure" allows for the incorporation of incidental impurities that may be introduced to the base material during the formation process. In some embodiments, the germanium (Ge) content of the crystalline germanium (Ge) containing layer 10 may be 95 at. % or greater. The aforementioned at. % allow for doping with an n-type or p-type dopant. In the embodiments, in which the crystalline germanium (Ge) containing layer 10 is substantially pure germanium (Ge), the crystalline germanium (Ge) containing layer 10 has a band gap that is equal to 0.67 eV. The Si content of the Ge containing layer 10 may be constant or vary across layer 10.

In some instances, when the silicon (Si) containing layer 5 is composed of pure silicon (Si), the crystalline germanium (Ge) containing layer 10 may be composed of silicon germanium (SiGe) or substantially pure germanium (Ge). In the embodiments in which the crystalline germanium (Ge) layer is composed of silicon germanium (SiGe), the germanium (Ge) content of the crystalline germanium (Ge) containing layer 10 may range from 10 at % to 100 at. % In another embodiment, in which the crystalline germanium (Ge) containing layer 10 is composed of silicon germanium (SiGe), the germanium (Ge) content of the crystalline germanium (Ge) containing layer 10 may range from 50 at % to 100 at %. The aforementioned atomic % allows for doping with an n-type or p-type dopants. In one embodiment, in which the crystalline germanium (Ge) containing layer 10 is silicon germanium (SiGe), the crystalline germanium (Ge) containing layer 10 has a band gap that is ranges from 0.67 eV to 1.0 eV. In another embodiment, in which the crystalline germanium (Ge) containing layer 10 is silicon germanium (SiGe), the crystalline germanium (Ge) containing layer 10 has a band gap that is ranges from 0.67 eV to 0.80 eV.

The crystalline germanium (Ge) containing layer 10 is typically doped to a first conductivity type. As used herein, the term "conductivity type" denotes a semiconductor material being p-type or n-type. To provide an emitter heterojunction, the conductivity type of the crystalline germanium (Ge) containing layer is selected to be opposite the conductivity type of the silicon (Si) containing layer 5. For example, when the crystalline germanium (Ge) containing layer 10 has a first conductivity type that is n-type, the silicon (Si) containing layer 5 has a second conductivity type that is p-type. In another example, when the crystalline germanium (Ge) containing layer 10 has a first conductivity type that is p-type, the silicon (Si) containing layer 5 has a second conductivity type that is n-type.

As used herein, "n-type" refers to the addition of impurities that contributes free electrons to an intrinsic semiconductor. In a type IV semiconductor, such as germanium (Ge) and/or silicon (Si), as employed in the crystalline germanium (Ge) containing layer 10, examples of n-type dopants, i.e., impurities, include but are not limited to, antimony (Sb), arsenic (As) and phosphorous (P). In one embodiment, in which the first conductivity type of the crystalline germanium (Ge) containing layer 10 is n-type, the n-type dopant is present in a concentration ranging from $1 \times 10^9$ atoms/cm$^3$ to $1 \times 10^{20}$ atoms/cm$^3$. In another embodiment, in which the first conductivity type is n-type, the n-type dopant is present in a concentration ranging from $1 \times 10^{14}$ atoms/cm$^3$ to $1 \times 10^{19}$. As used herein, "p-type" refers to the addition of impurities to an intrinsic semiconductor that creates deficiencies of valence electrons (i.e. holes). In a type IV semiconductor, such as germanium (Ge) and/or silicon (Si), examples of p-type dopants, i.e., impurities, include but are not limited to, boron (B), aluminum (Al), gallium (Ga) and indium (In). In one embodiment, in which the crystalline germanium (Ge) containing layer 10 is p-type, the p-type dopant is present in a concentration ranging from $1 \times 10^9$ atoms/cm$^3$ to $1 \times 10^{20}$ atoms/cm$^3$. In another embodiment, in which the first conductivity type is p-type, the p-type dopant is present in a concentration ranging from $1 \times 10^{14}$ atoms/cm to $1 \times 10^{19}$ atoms/cm$^3$. The dopant that provides the first conductivity of the crystalline germanium (Ge) containing layer 10 may be introduced using an in situ doping process or using ion implantation and/or diffusion. By "in situ" it is meant that the dopant that provides the conductivity type of the material layer is introduced as the material layer is being formed or deposited.

The dopant concentration that provides the first conductivity type of the crystalline germanium (Ge) containing layer 10 may be graded or uniform. By "uniform" it is meant that the dopant concentration is the same throughout the entire thickness of a material layer, such as the crystalline germanium (Ge) containing layer 10. For example, a crystalline germanium (Ge) containing layer 10 having a uniform dopant concentration may have the same dopant concentration at the upper surface and bottom surface of the material layer that provides the crystalline germanium (Ge) containing layer 10, as well as the same dopant concentration at a central portion of the crystalline germanium (Ge) containing layer 10 between the upper surface and the bottom surface. By "graded" it is meant that the dopant concentration varies throughout the thickness of a material layer, such as a crystalline germanium (Ge) containing layer 10. For example, a germanium (Ge) containing layer 10 having a graded dopant concentration may have an upper surface with a greater dopant concentration than the bottom surface of the crystalline germanium (Ge) containing layer 10, and vice versa. In another example, the greatest dopant concentration of the crystalline semiconductor material that provides the crystalline germanium (Ge) containing layer 10 may be present in a central portion of the crystalline germanium (Ge) containing layer 10 between the upper surface and the bottom surface of the crystalline germanium (Ge) containing layer 10. In some embodiments, the dopant gas flow ratio may be varied during epitaxial growth via plasma enhanced chemical vapor deposition to provide a crystalline germanium (Ge) containing layer 10 having a graded dopant concentration. Similarly, the Ge containing layer 10 may have a graded composition, i.e. the Si content of the Ge containing layer 10 may vary across layer 10.

In some embodiments, the crystalline germanium (Ge) containing layer 10 has a thickness ranging from 100 nm to 1 mm. In another embodiment, the crystalline germanium (Ge) containing layer 10 has a thickness ranging from 1 μm to 300 μm. In yet another embodiment, the thickness of the crystalline germanium (Ge) containing layer 10 ranges from 1 μm to 5 μm. In some embodiments, the crystalline germanium (Ge) containing layer 10 is a material that that is transferred to the photovoltaic device 100 using a layer transfer method, such as spalling. For example, the crystalline germanium (Ge) containing layer 10 may be transferred from a germanium (Ge) containing substrate. More specifically, a handling substrate, such as a flexible polymeric substrate, may be engaged to the germanium (Ge) containing substrate. In some instances, the flexible polymeric substrate that provides the handling substrate can be a pressure sensitive tape. In some embodiments, a stressor material layer, such as a metal layer may be present between the handling substrate and the germanium (Ge) containing substrate. The stressor material layer may be composed of Ti/W, Ti, Cr, Ni or any combination thereof. In some other embodiments, the stressor material layer may be provided by the flexible polymeric substrate. The stressor material layer may induce a stress to the germanium (Ge) containing substrate, which causes the germanium (Ge) containing substrate to be cleaved, i.e., spalled. Additional stresses to induce spalling may be applied to the germanium (Ge) containing substrate through the handling substrate, e.g., flexible polymeric substrate.

In some embodiments, following spalling of the germanium (Ge) containing substrate the portion that remains connected to the handling substrate provides the crystalline germanium (Ge) containing layer 10. The portion of the germanium (Ge) containing substrate that is separated from the handling substrate may be re-used to provide other crystalline germanium (Ge) containing material layers for other photovoltaic and/or semiconductor devices. In some embodiments, following spalling of the germanium (Ge) containing substrate, a material layer, such as the silicon (Si) containing layer 5, may be formed on the crystalline germanium (Ge) containing layer and the handling substrate may be removed. In other embodiments, at least one material layer, such as the silicon (Si) containing layer 5, is formed on the germanium (Ge) containing substrate before the spalling operation. In some embodiments, the crystalline germanium (Ge) containing layer 10 is formed on a silicon (Si) containing host substrate before being transferred to the handling substrate using layer transfer methods, such as spalling. In some embodiments, multiple layer transfers and multiple handling substrates may be utilized to provide the crystalline germanium (Ge) containing layer 10 from a germanium (Ge) containing substrate. It is noted that layer transfer is not the only method for providing the crystalline germanium (Ge) containing layer 10. For example, when the crystalline germanium (Ge) containing layer 10 is composed of poly-germanium (Ge), the crystalline germanium (Ge) containing layer 10 may be obtained by thermal (or e-beam) evaporation at high deposition rates to reduce deposition cost (followed by recrystallization, if necessary).

In some embodiments, the bottom cell 25 of the photovoltaic device 100 includes a heterojunction of a crystalline germanium containing (Ge) nanowire 11 and a silicon (Si) containing layer, wherein the crystalline germanium containing (Ge) nanowire 11 provides the absorption layer of the bottom cell 25 and the silicon (Si) containing layer 5 is a component of the emitter contact to the bottom cell 25. The crystalline germanium containing (Ge) nanowire 11 may be provided by the germanium (Ge) containing layer 10, in which the germanium (Ge) containing layer 10 may have a columnar topography, as depicted in FIG. 1A. As used herein, the term "nanowire" means a structure having an aspect ratio (height:width) that is greater than 5:1. Referring to FIG. 1A, the height d2 of each nanowire 11 may range from 50 nm to 10 µm, and the width d1 of each nanowire 11 may range from 10 nm to 1 µm. In another embodiment, the height d4 of each nanowire 11 may range from 250 nm to 5 µm, and the width d1 of each nanowire 11 may range from 50 nm to 500 nm.

In some embodiments, the crystalline germanium containing (Ge) nanowires 11 are formed from the germanium (Ge) containing layer 10 using photolithography and etch processes. In one embodiment, a layer of photoresist material is applied atop the germanium (Ge) containing layer 10 via spin coating or similar processes. The photoresist material may be comprised of a dielectric material including carbon, oxygen, and various inorganic materials. Following application of the photoresist layer, the photoresist is typically soft-baked, where the solvents of the photoresist layer are evaporated via heating. The layer of photoresist is then patterned using a photolithography process. For example, a pattern is formed using a reticle or photomask and transferred into the layer of photoresist on the surface to be etched. Light is passed through the opaque pattern of the reticle, which in turn produces a patterned image on the layer of photoresist. The photoresist layer is a light or radiation sensitive material and exposure to light causes changes in the photoresist structure. For example, exposure to light may change the exposed portions of the photoresist from a soluble condition to an insoluble one.

Following exposure, the pattern is developed utilizing a resist developer, such as a chemical solvent. The developer leaves a hole in the resist layer that corresponds to the opaque pattern of the reticle. An alternative resist strategy, commonly referred to as a negative resist, leaves a pattern in the resist opposite to that on the mask. Development of the pattern is conducted using development techniques including, but not limited to: continuous spray development and puddle development. Following development of the patterned photoresist layer a photoresist mask is formed.

Following formation of the photoresist mask over the layer of hard mask material, an etch process is employed to etch the germanium (Ge) containing layer 10 selectively to the photoresist mask. As used herein, the term "selective" in reference to a material removal process denotes that the rate of material removal for a first material is greater than the rate of removal for at least another material of the structure to which the material removal process is being applied. For example, a selective etch may remove one material to a second material at a rate that is greater than 10:1. In another example, a selective etch may remove one material to a second material at a rate that is greater than 100:1. In one embodiment, the etch process that etches the germanium (Ge) containing layer 10 to provide the crystalline germanium containing (Ge) nanowire 11 is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

In one embodiment, the etch process for forming the crystalline germanium containing (Ge) nanowire 11 is timed so that the remaining thickness d3 of the crystalline germanium (Ge) containing layer 10 in the etched portions of the layer is greater than 50 nm. In another embodiment, the remaining thickness d3 of the crystalline germanium (Ge) containing layer 10 in the etched portions of the layer may range from 50 nm to 1 µm. In yet another embodiment, the remaining thickness d3 of the germanium (Ge) containing layer 10 in the etched portions of the layer may range from 100 nm to 250 nm. The height d2+d3 of the crystalline germanium containing (Ge) nanowire 11 is typically equal to the original thickness of the germanium (Ge) containing layer 10. The height d2, i.e., length, of the removed portion of the germanium (Ge) containing layer 10 that defines the depth of the trenches between adjacent crystalline (Ge) germanium containing nanowires 11 may range from 50 nm to 10 μm.

It is noted that the above thicknesses for the height d2 of the crystalline germanium containing (Ge) nanowire 11, the width d1 of the crystalline germanium (Ge) containing nanowire 11, and the remaining thickness d3 of the crystalline germanium (Ge) containing layer 10 are provided for illustrative purposes only, as other ranges and subranges can be employed and are thus within the scope of the present disclosure. Typically, the width d1 of the crystalline germanium (Ge) containing nanowire 11 and the height d3 of the removed portion of the germanium (Ge) containing layer 10 that provides the trenches between adjacent crystalline germanium (Ge) containing nanowires 11 is shorter than the diffusion length of minority carriers in the germanium (Ge) or silicon germanium (SiGe) of the crystalline germanium (Ge) containing nanowire 11. The diffusion length of minority carriers in Ge containing layer 10 depends on the crystalline quality, purity (lack or presence of near-midgap recombination centers caused by metal impurity), and doping level of the Ge containing layer 10, and may range from a few tens of nanometers to a few millimeters. The presence of structural defects (i.e. crystal imperfection), recombination centers resulting from metal contamination and doping reduce the diffusion length of minority carriers. The portion of the crystalline germanium (Ge) containing nanowires 11 having a length that is equal to the height d2 that defines the depth of the trenches between adjacent crystalline germanium (Ge) containing nanowires 11 is typically large enough to allow sufficient light absorption, i.e., sufficiently larger than the effective absorption length. The effective absorption length refers to the depth at which the majority of the incident phonons present in the solar spectrum are (i.e. >90%) are absorbed in the semiconductor. This length is typically >4 μm in the case of pure crystalline Ge and >40 μm in the case of pure Si. Therefore the effective absorption length in the Ge containing layer 10 increases by increasing the Si content of the Ge containing layer 10. Although the following description refers to the crystalline germanium (Ge) containing layer 10 as a having the geometry of the crystalline germanium (Ge) nanowires 11, it is noted that the present disclosure is not intended to be limited to only this geometry. The nanowire geometry can be optional. For example, although the silicon (Si) containing layer 5 that provides at least an emitter portion of the bottom cell 25 is depicted in the supplied figures as being formed on the stepped face of the crystalline germanium (Ge) containing nanowires 11, embodiments include wherein the crystalline germanium (Ge) containing layer 10 does not have a nanowire geometry, and the silicon containing layer 5 is formed on a planar face of the crystalline germanium (Ge) containing layer 10.

Figure 2A:
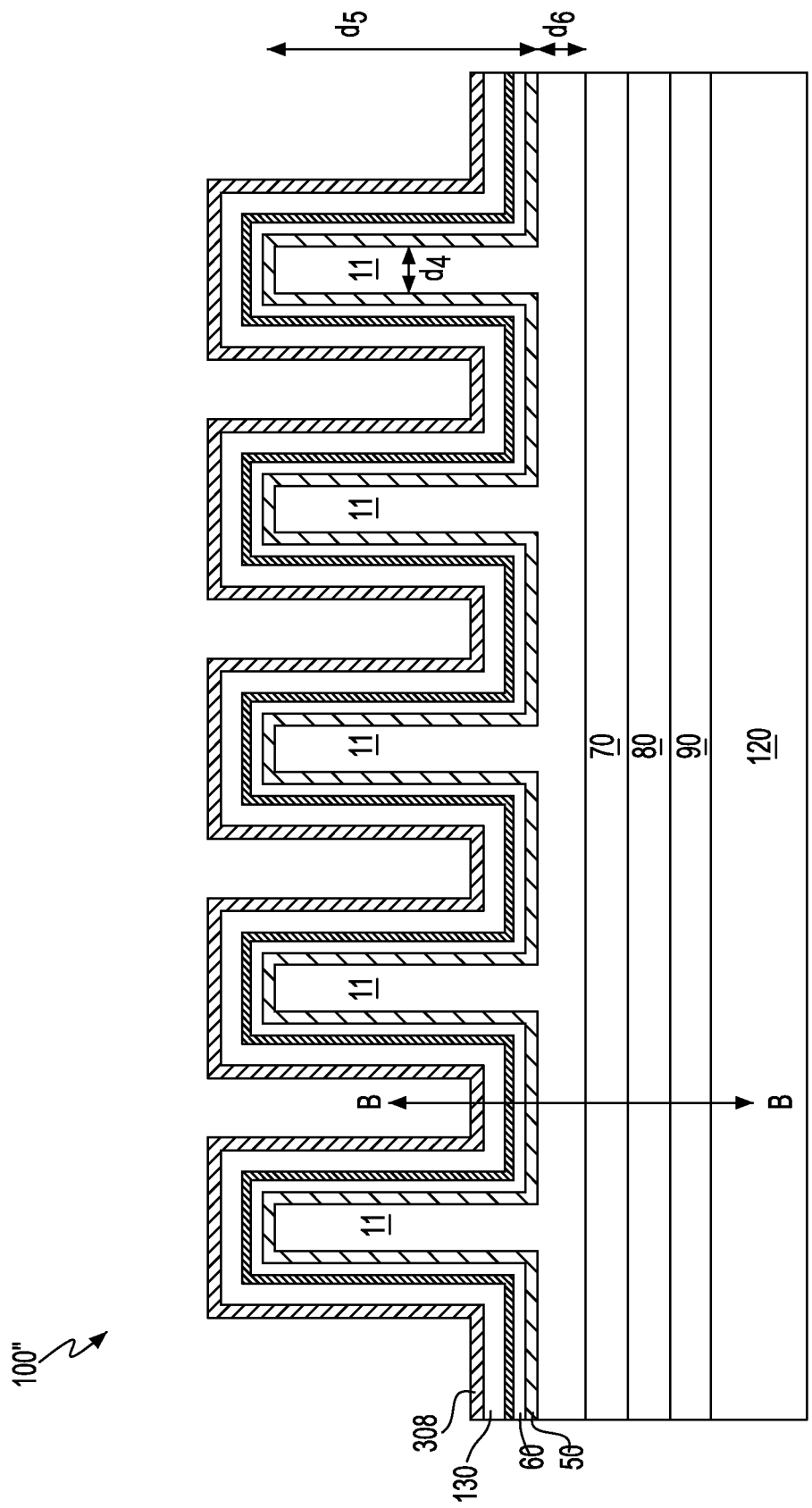
FIG. 2A is a side cross-sectional view of a photovoltaic device including a cadmium (Cd) containing upper cell and a germanium (Ge) containing bottom cell, in which the bottom cell includes a heterojunction of a crystalline germanium containing (Ge) nanowire and a silicon (Si) containing layer, in accordance with one embodiment of the present disclosure.

Referring to FIGS. 1A and 2A, the silicon (Si) containing layer 5 that is formed on the crystalline germanium (Ge) containing nanowires 11 provides a least a portion of the emitter, e.g., emitter contact, to the absorption layer of the bottom cell 25 that is provided by the crystalline germanium (Ge) containing nanowires 11. The silicon (Si) containing layer 5 is crystalline. For example, the silicon (Si) containing layer 5 may be polycrystalline, multi-crystalline or the silicon (Si) containing layer 5 may have a single crystal crystalline structure. The silicon containing layer 5 has a greater band gap than the crystalline germanium (Ge) containing nanowires 11. To provide a larger band gap in the silicon (Si) containing layer 5 that provides the emitter contact to the bottom cell 25 (also referred to as first cell), the silicon (Si) content in the silicon (Si) containing layer 5 is selected to be greater than the silicon (Si) content of the crystalline germanium (Ge) containing nanowires 11.

In some instances, when the crystalline germanium (Ge) containing nanowire 11 is composed of silicon germanium (SiGe) or substantially pure germanium (Ge), the silicon (Si) containing layer 5 may be substantially pure silicon (Si). By substantially pure it is meant that the silicon (Si) containing layer 5 may be composed of a base material that is 99 at. % silicon (Si) or greater, e.g., 100 at. % silicon (Si). In some embodiments, the silicon (Si) content of the silicon (Si) containing layer 5 may be 95 at. % or greater. The aforementioned atomic % allow for doping with an n-type or p-type dopant. In the embodiments, in which the silicon (Si) containing layer 5 is substantially pure silicon (Si), the silicon (Si) containing layer 5 has a band gap that is equal to 1.12 eV.

In other embodiments, in which the crystalline germanium (Ge) containing nanowire 11 is composed of silicon germanium (SiGe) or substantially pure germanium (Ge), the silicon (Si) containing layer 5 may be composed of silicon germanium (SiGe) so long as the silicon content in the silicon (Si) containing layer 5 is greater than the silicon content in the germanium (Ge) containing nanowire 11. In some examples, in which the silicon (Si) containing layer 5 is composed of silicon germanium (SiGe), the germanium (Ge) content of the silicon (Si) containing layer 5 may range from 0 at % to 50 at. %. In another embodiment, in which the silicon (Si) containing layer 5 was composed of silicon germanium (SiGe), the germanium content of the silicon (Si) containing layer 5 may range from 0 at % to 25 at %. The aforementioned atomic % allow for doping with an n-type or p-type dopants. In one embodiment, in which the silicon (Si) containing layer 5 is silicon germanium (SiGe), the silicon (Si) containing layer 5 has a band gap that is ranges from 0.85 eV to 1.12 eV. In another embodiment, in which the silicon (Si) containing layer 5 is silicon germanium (SiGe), the silicon (Si) containing layer 5 has a band gap that is ranges from 0.95 eV to 1.12 eV.

The silicon (Si) containing layer 5 is typically doped to a second conductivity type that is opposite the conductivity type of the crystalline germanium (Ge) containing nanowire 11. For example, referring to FIGS. 1A-1C, in some embodiments when the first conductivity type of the crystalline germanium (Ge) containing nanowire 11 in the bottom cell 25 is n-type, the second conductivity of the silicon (Si) containing layer is p-type. In another embodiment, when the first conductivity type of the crystalline germanium (Ge) containing nanowire 11 in the bottom cell 25 is p-type, the second conductivity of the silicon (Si) containing layer 5 is n-type. Examples of n-type dopants, i.e., impurities, to provide the second conductivity of the silicon (Si) containing layer 5 include but are not limited to, antimony (Sb), arsenic (As) and phosphorous (P). Examples of p-type dopants, i.e., impurities, to provide the second conductivity of the silicon (Si) containing layer 5 include but are not limited to, boron (B), aluminum (Al), gallium (Ga) and indium (In). The dopant concentration of the p-type or n-type dopant that provides the second conductivity of the silicon (Si) containing layer 5 may range from $1 \times 10^{15}$ atoms/cm$^3$ to $1 \times 10^{21}$ atoms/cm$^3$. In another embodiment, the dopant concentration of the p-type or n-type dopant that provides the second conductivity of the silicon (Si) containing nanowire 11 may range from $5 \times 10^{17}$ atoms/cm$^3$ to $3 \times 10^{20}$. The dopant that provides the second conductivity of the silicon (Si) containing layer 5 may be introduced using an in situ doping process or using ion implantation and/or diffusion. By "in situ" it is meant that the dopant that provides the conductivity type of the material layer is introduced as the material layer is being formed or deposited.

The silicon (Si) containing layer 5 may have a conformal thickness that is present on the stepped surface of the crystalline germanium (Ge) containing nanowires 11. The term "conformal" denotes a layer having a thickness that does not deviate from greater than or less than 20% of an average value for the thickness of the layer. The thickness of the silicon (Si) containing layer 5 may range from 2 nm to 2 μm. In another embodiment, the thickness of the silicon (Si) containing layer 5 ranges from 3 nm to 500 nm. In yet another embodiment, the thickness of the silicon (Si) containing layer 5 ranges from 3 nm to 25 nm.

Referring to FIGS. 1A-1C, the silicon (Si) containing layer 5 may be epitaxially grown on the crystalline germanium (Ge) containing nanowires 11. "Epitaxial growth and/or deposition" means the growth of a semiconductor material on a deposition surface of a semiconductor material, in which the semiconductor material being grown has the same (or nearly the same) crystalline characteristics as the semiconductor material of the deposition surface. Therefore, in the embodiments in which the crystalline germanium (Ge) containing nanowires 11 have a single crystal crystalline structure, the silicon (Si) containing layer 5 that is epitaxially grown on the crystalline germanium (Ge) containing nanowires 11 will also have a single crystal crystalline structure. Further, in the embodiments in which the first crystalline material of the crystalline germanium (Ge) containing nanowires 11 has a polycrystalline or multi-crystalline structure, the silicon (Si) containing layer 5 that is epitaxially grown on the crystalline germanium (Ge) containing nanowires 11 will also have a polycrystalline or multi-crystalline structure.

In some embodiments, the epitaxially grown silicon (Si) containing layer 5 may be formed using a chemical vapor deposition (CVD) process, such as plasma enhanced chemical vapor deposition (PECVD). For example, the plasma enhanced chemical vapor deposition (PECVD) method of present disclosure allows for the silicon (Si) containing layer 5 to be epitaxially formed on the crystalline germanium (Ge) containing nanowires 11 at temperatures of less than 500° C., e.g., less than 250° C. The temperatures disclosed herein for the epitaxial growth of the silicon (Si) containing layer 5 are measured at the deposition surface, and may also be referred to as substrate temperatures. Plasma enhanced chemical vapor deposition (PECVD) is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or DC discharge between two electrodes, the space between which is filled with the reacting gases. In one example, a PECVD device employs a parallel plate chamber configuration.

The silicon (Si) containing layer 5 may be epitaxially grown via plasma enhanced chemical vapor deposition (PECVD) from a mixture of silane ($SiH_4$), hydrogen ($H_2$) and dopant gasses. Other gases such as $Si_2H_6$, $SiF_4$, $GeH_4$ and $CH_4$ may be used for growing c-SiGe (crystalline silicon germanium), or incorporating carbon (C) into the c-Si (crystalline silicon) or c-SiGe (crystalline silicon germanium) film. In one embodiment, to provide epitaxial growth of a silicon (Si) containing layer 5 composed of a silicon containing material and doped to a second conductivity, e.g., n-type conductivity or p-type conductivity, at temperatures of less than 500° C., the ratio of hydrogen gas ($H_2$) to silane precursor gas ($SiH_4$), i.e. $[H_2]/[SiH_4]$ is selected to be greater than 5:1. In another embodiment, $[H_2]/[SiH_4]$ ranges from 5:1 to 1000:1. For example, epitaxial growth of silicon is possible at temperatures as low as 150° C. with $[H_2]/[SiH_4]$ ranging from 5:1 to 20:1. In one embodiment, to provide epitaxial growth of a silicon (Si) containing layer 5 composed of a silicon-germanium containing material and doped to a second conductivity, e.g., n-type conductivity or p-type conductivity, at temperatures of less than 500° C., the ratio of hydrogen gas ($H_2$) to silane precursor gas ($SiH_4$) and germane precursor gas ($GeH_4$) i.e. $[H_2]/([SiH_4]+[GeH_4])$ is selected to be greater than 5:1. In another embodiment, $[H_2]/([SiH_4]+[GeH_4])$ ranges from 5:1 to 1000:1. For example, epitaxial growth of silicon-germanium is possible at temperatures as low as 150° C. with $[H_2]/([SiH_4]+[GeH_4])$ ranging from 5:1 to 20:1.

The dopant gasses of the low temperature PECVD process provide the conductivity type of the silicon (Si) containing layer 5. More specifically, as the silicon (Si) containing layer 5 is epitaxially grown it is in-situ doped. The in-situ doping of the n-type dopants can be effected by adding a dopant gas including at least one n-type dopant, e.g., phosphorus or arsenic, into the gas stream into the process chamber. For example, when phosphorus is the n-type dopant, the dopant gas can be phosphine ($PH_3$), and when arsenic is the n-type dopant, the dopant gas can be arsine ($AsH_3$). In one example, when the second conductivity type dopant is n-type, the dopant gasses include phosphine gas ($PH_3$) present in a ratio to silane ($SiH_4$) ranging from 0.01% to 10%. In another example, when the second conductivity type dopant is n-type, the dopant gasses include phosphine gas ($PH_3$) present in a ratio to silane ($SiH_4$) ranging from 0.1% to 2%. In one example, a silicon (Si) containing layer 5 of single crystal silicon was epitaxial grown on a crystalline germanium (Ge) containing nanowire 11 at a temperature of 150° C., wherein the silicon (Si) containing layer 5 has an n-type conductivity provided by phosphorus dopant present in a concentration greater than $1\times10^{20}$ cm$^{-3}$.

The in-situ doping of p-type dopant to provide the second conductivity type in the silicon (Si) containing layer 5 can be effected with a dopant gas including at least one p-type dopant, e.g., B, into the gas stream into the process chamber. For example, when boron is the p-type dopant, the dopant gas can be diborane ($B_2H_6$). In one embodiment, wherein the second conductivity type dopant is p-type, the dopant gasses for forming the silicon (Si) containing layer 5 may be diborane ($B_2H_6$) present in a ratio to silane ($SiH_4$) ranging from 0.01% to 10%. In another embodiment, wherein the second conductivity type dopant is p-type, the dopant gasses for forming the silicon (Si) containing layer 5 may be diborane ($B_2H_6$) present in a ratio to silane ($SiH_4$) ranging from 0.1% to 2%. In yet another embodiment, in which the second conductivity type dopant is p-type, the dopant gasses for forming the silicon (Si) containing layer 5 may be trimethylboron (TMB) present in a ratio to silane ($SiH_4$) ranging from 0.1% to 10%.

The dopant that is introduced to the silicon (Si) containing layer 5 may be uniform in concentration or may have a graded concentration. By "uniform" it is meant that the dopant concentration is the same throughout the entire thickness of the silicon (Si) containing layer 5. For example, a silicon (Si) containing layer 5 having a uniform dopant concentration may have the same dopant concentration at the upper surface and bottom surface of the silicon (Si) containing layer 5, as well as the same dopant concentration at a central portion of the silicon (Si) containing layer 5 between the upper surface and the bottom surface of the silicon (Si) containing layer 5. By "graded" it is meant that the dopant concentration varies throughout the thickness of the silicon (Si) containing layer 5. For example, a silicon (Si) containing layer 5 having a graded dopant concentration may have an upper surface with a greater dopant concentration than the bottom surface of the silicon (Si) containing layer 5, and vice versa. In another example, the greatest dopant concentration of the silicon (Si) containing layer 5 may be present in a central portion of the silicon (Si) containing layer 5 between the upper surface and the bottom surface of the silicon (Si) containing layer 5. In one embodiment, to provide a graded dopant concentration in the silicon (Si) containing layer 5, the gas flow ratio for the dopant gas may be varied during epitaxial growth of the silicon (Si) containing layer 5 by PECVD. In one embodiment where the Si containing layer 5 is comprised of silicon-germanium, the Ge content of the Si containing layer 5 varies across the Si containing layer 5. This may be achieved by varying the ratio of the Ge containing gas precursor (such as $GeH_4$) to the Si containing precursor (such as $SiH_4$) during the PECVD growth of the Si containing layer 5.

The pressure for the low temperature PECVD process for epitaxially growing the silicon (Si) containing layer 5 ranges from 10 mTorr to 5 Torr, and in one example may be in the range of 250 mtorr to 900 mTorr. The power density for the low temperature PECVD process for epitaxially growing the silicon (Si) containing layer 5 may range from 1 $mW/cm^2$ to 100 $mW/cm^2$, and in one example may be in the range of 3 $mW/cm^2$ to 10 $mW/cm^2$. Further details regarding the epitaxial growth process for forming the silicon (Si) containing layer 5 of the present disclosure are described in U.S. patent application Ser. No. 13/032,866 (titled "Ultra Low-temperature selective epitaxial growth of Silicon for device integration"), which is incorporated herein by reference.

Referring to FIGS. 1A and 1B, the silicon (Si) containing layer 5 is one layer that is present in the emitter contact to the absorption layer that is provided by the crystalline germanium (Ge) containing nanowires 11. The emitter contact may also include a semiconductor front contact layer 6 that is present atop the silicon (Si) containing layer 5, which may be either intrinsic or having the same conductivity type as that of layer 5. The term "intrinsic semiconductor", also called an undoped semiconductor or i-type semiconductor, is a substantially pure semiconductor without any significant dopant species present. The number of charge carriers in the intrinsic semiconductor is determined by the properties of the material itself instead of the amount of impurities, i.e., dopants. Typically, in intrinsic semiconductors the number of excited electrons and the number of holes are equal (n=p). The semiconductor front contact layer 6 can serve to passivate the top surface of the silicon (Si) containing layer 5, and reduce electron-hole recombination. The semiconductor front contact layer 6 is typically, but not necessarily always, hydrogenated. The semiconductor front contact layer 6 may also have an amorphous crystal structure. The term "amorphous" means that the structure lacks a defined repeating crystal structure. The semiconductor front contact layer 6 may also be crystalline, such as monocrystalline, polycrystalline, multicrystalline, micro-crystalline and nano-crystalline. In one example, in which the silicon (Si) containing layer 5 is composed of p-type crystalline silicon germanium (SiGe), the semiconductor front contact layer 6 is composed of intrinsic or p-type hydrogenated amorphous silicon germanium (i or $p^+$ α-SiGe:H). In another example, in which the silicon (Si) containing layer 5 composed of p-type crystalline silicon germanium (SiGe), the semiconductor front contact layer 6 is composed of intrinsic or p-type hydrogenated amorphous silicon (i or p+α-Si:H).

The semiconductor front contact layer 6 can be formed utilizing any chemical or physical growth process including any semiconductor precursor source material. Examples of chemical vapor deposition (CVD) methods that are suitable for forming the intrinsic semiconductor front contact layer 6 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The semiconductor front contact layer 6 may also be deposited using evaporation, chemical solution deposition, spin on deposition, and physical vapor deposition (PVD) methods. In some embodiments, the hydrogenated semiconductor containing material, e.g., hydrogenated amorphous silicon germanium (α-SiGe:H) and/or hydrogenated amorphous silicon germanium (α-SiGe:H), used in forming the semiconductor front contact layer 6 is deposited in a process chamber containing a semiconductor precursor source gas and a carrier gas including hydrogen. Hydrogen atoms in the precursor source gas or in the hydrogen gas within the carrier gas are incorporated into the deposited material to form the semiconductor front contact layer 6. In some embodiments, the semiconductor front contact layer 6 may be formed using the low temperature plasma enhanced chemical vapor deposition method that is described above for forming the silicon (Si) containing layer 5. Typically, the thickness of the semiconductor front contact layer 6 is from 2 nm to 15 nm, although lesser and greater thicknesses can also be employed. The semiconductor front contact layer 6 is optional, and may be omitted. In embodiments where the semiconductor front contact layer 6 is doped, doping is achieved by flowing dopant gas sources along with the precursor gas. For example, $B_2H_6$ or TMB may be used for p-type doping, and $PH_3$ may be used for n-type doping.

Referring to FIGS. 1A and 1B, in some embodiments, a back contact structure may be present and in contact with the surface of the crystalline germanium (Ge) containing nanowires 11 that is opposite the surface of the crystalline germanium (Ge) containing nanowires 11 that is in contact with the emitter contact, e.g., the silicon (Si) containing layer 5. The surface of the crystalline germanium (Ge) containing nanowires 11 that is opposite the surface of the crystalline germanium (Ge) containing nanowires 11 that is in contact with the emitter contact is hereafter referred to as the back surface of the crystalline germanium (Ge) containing nanowires 11. In one embodiment, the back contact structure may include a back intrinsic semiconductor contact layer 7 and a doped semiconductor back contact layer 8 having the same conductivity type as the crystalline germanium (Ge) containing nanowires 11.

In one embodiment, the intrinsic semiconductor back contact layer 7 may have a crystalline or amorphous crystal structure. In some example, when the intrinsic semiconductor back contact layer 7 has a crystalline crystal structure, the crystal structure of the intrinsic semiconductor back contact layer 7 may be single crystalline, polycrystalline, multi-crystalline, micro-crystalline and/or monocrystalline. In one embodiment, the intrinsic semiconductor back contact layer 7 can serve to passivate the back surface of the crystalline germanium (Ge) containing nanowires 11, and reduce electron-hole recombination.

The intrinsic semiconductor back contact layer 7 may be composed of a silicon containing semiconductor including, but not limited to, silicon (Si), germanium (Ge), silicon germanium (SiGe) and compound semiconductors, such as type III-V semiconductors. The intrinsic semiconductor back contact layer 7 is typically, but not necessarily always hydrogenated. In one example, in which the crystalline germanium (Ge) containing nanowires 11 are composed of n-type germanium (Ge), the intrinsic semiconductor back contact layer 7 is composed of intrinsic hydrogenated amorphous silicon carbide (i α-SiC:H). In some embodiments, the intrinsic semiconductor back contact layer 7 is in direct contact with the back surface of the intrinsic semiconductor back contact layer 7, as depicted in FIGS. 1A and 1B.

The intrinsic semiconductor back contact layer 7 may be formed utilizing any chemical or physical growth process including any semiconductor precursor source material. Examples of chemical vapor deposition (CVD) methods that are suitable for forming the back intrinsic semiconductor contact layer 7 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The intrinsic semiconductor back contact layer 7 may also be deposited using evaporation, chemical solution deposition, spin on deposition, and physical vapor deposition (PVD) methods.

In some embodiments, the intrinsic hydrogenated semi-conductor containing material, e.g., intrinsic hydrogenated amorphous silicon carbide (i α-SiC:H), used in forming the intrinsic semiconductor back contact layer 7 is deposited in a process chamber containing a semiconductor precursor source gas and a carrier gas including hydrogen. Hydrogen atoms in the precursor source gas or in the hydrogen gas within the carrier gas are incorporated into the deposited material to form the intrinsic semiconductor back contact layer 7. In some embodiments, the intrinsic semiconductor back contact layer 7 may be formed using the low temperature plasma enhanced chemical vapor deposition method that is described above for forming the silicon (Si) containing layer 5. Typically, the thickness of the intrinsic semiconductor back contact layer 7 is from 2 nm to 15 nm, although lesser and greater thicknesses can also be employed. The intrinsic semiconductor back contact layer 7 is optional, and may be omitted.

Referring to FIGS. 1A and 1B, the doped semiconductor back contact layer 8 may function as a back surface field layer and can serve to passivate the back surface of the absorption layer that is provided by the crystalline germanium (Ge) containing nanowires 11, and reduce electron-hole recombination. The doped semiconductor back contact layer 8 may be a type IV semiconductor material, such as silicon (Si), silicon germanium (SiGe), germanium (Ge) or other silicon containing and germanium containing materials. The doped semiconductor back contact layer 8 may have a crystalline or amorphous crystal structure. In some embodiments are, when the doped semiconductor back contact layer 8 has a crystalline crystal structure, the crystal structure of the doped semiconductor back contact layer 8 may be single crystalline, polycrystalline, multi-crystalline, micro-crystalline and/or monocrystalline.

The doped semiconductor back contact layer 8 typically has the same conductivity type as the crystalline germanium (Ge) containing nanowires 1. For example, when the first conductivity of the crystalline germanium (Ge) containing nanowires 11 is n-type, the conductivity type of the doped semiconductor back contact layer 8 is n-type, as depicted in FIGS. 1A-1C. Examples of n-type and p-type dopants for type IV semiconductor materials that are suitable for the doped semiconductor back contact layer 8 have been described above. For example, when the doped semiconductor back contact layer 8 is a type IV semiconductor having an n-type conductivity, the n-type dopant may be phosphorous (P). In another example, when the doped semiconductor back contact layer 8 is a type IV semiconductor having a p-type conductivity, the p-type dopant may be boron (B). Typically, the dopant concentration that dictates the conductivity type of the doped semiconductor back contact layer 8 is greater than the dopant concentration that dictates the conductivity type of the crystalline germanium (Ge) containing nanowires 11. For example, in one embodiment, in which the dopant concentration of the n-type or p-type dopant that is present in the crystalline germanium (Ge) containing nanowires 11 ranges from $10^9$ atoms/cm$^3$ to $10^{20}$ atoms/cm$^3$, the dopant concentration of the n-type or p-type dopant in the doped semiconductor back contact layer 8 ranges from $10^{16}$ atoms/cm$^3$ to $5 \times 10^{20}$ atoms/cm$^3$. In another example, in which the dopant concentration of the n-type or p-type dopant that is present in the crystalline germanium (Ge) containing nanowires 11 ranges from $10^{14}$ atoms/cm$^3$ to $10^{19}$ atoms/cm$^3$, the dopant concentration of the n-type or p-type dopant in the doped semiconductor back contact layer 8 ranges from $10^7$ atoms/cm$^3$ to $10^{20}$ atoms/cm$^3$.

In some embodiments, the doped semiconductor back contact layer 8 has the same base semiconductor material as the intrinsic semiconductor back contact layer 7. For example, in one embodiment, where the intrinsic semiconductor back contact layer 7 is composed of hydrogenated amorphous silicon carbide (i α-SiC:H), the doped semiconductor back contact layer 8 may be composed of n-type or p-type hydrogenated amorphous silicon carbide (n$^+$ or p$^+$ α-SiC:H). As another example, in one embodiment, where the intrinsic semiconductor back contact layer 7 is composed of hydrogenated amorphous silicon (i α-Si:H), the doped semiconductor back contact layer 8 may be composed of n-type or p-type hydrogenated amorphous silicon (n$^+$ or p$^+$ α-Si:H) In other embodiments, the doped semiconductor back contact layer 8 has a different base semiconductor material as the intrinsic semiconductor back contact layer 7. in one embodiment, where the intrinsic semiconductor back contact layer 7 is composed of hydrogenated amorphous silicon (i α-Si:H), the doped semiconductor back contact layer 8 may be composed of n-type or p-type hydrogenated amorphous silicon carbide (n$^+$ or p$^+$ α-SiC:H). As another example, in one embodiment, where the intrinsic semiconductor back contact layer 7 is composed of hydrogenated amorphous silicon (i α-Si:H), the doped semiconductor back contact layer 8 may be composed of n-type or p-type hydrogenated amorphous silicon germanium (n$^+$ or p$^+$ α-SiGe:H).

The doped semiconductor back contact layer 8 can be formed utilizing any deposition or growth process. In one embodiment, the process includes an in-situ doped epitaxial growth process in which the dopant atom is introduced with the semiconductor precursor source material, e.g., a silane, during the formation of the doped semiconductor back contact layer 8. The doped semiconductor back contact layer 8 may also be formed using the low temperature plasma enhanced chemical vapor deposition process that is described above for forming the silicon (Si) containing layer of the emitter contact structure. In another embodiment, the dopant can be introduced into the intrinsic semiconductor back contact layer 7 to form the doped semiconductor back contact layer 8 using one of ion implantation, gas phase doping, liquid solution spray/mist doping, and/or out-diffusion of a dopant atom from an overlying sacrificial dopant material layer that can be formed on the undoped semiconductor material, and removed after the out-diffusion process. The thickness of the doped semiconductor back contact layer 8 may vary depending on the exact conditions used in forming the layer. Typically, the doped semiconductor back contact layer 8 has a thickness from 1 nm to 1 mm, with a thickness from 2 nm to 5 μm being more typical.

The order of forming the front contact, i.e., emitter contact, and the back contact to the absorption layer that is provided by the crystalline germanium (Ge) containing nanowires 11 is typically not critical to the present disclosure. For example, the material layers that provide the front contact, i.e., emitter contact, can be formed first and then the material layers that provide the back contact can be formed. In another embodiment, the material layers that provide the back contact can be formed first and then the material layers for the front contact can be formed.

Referring to FIGS. 1A and 1B and, in one embodiment, a back contact transparent conductive material layer 9 can be formed in contact with the surface of the doped semiconductor back contact layer 8 that is opposite the surface of the doped semiconductor back contact layer 8 that is in contact with the intrinsic semiconductor back contact layer 7. Throughout this disclosure, an element is "transparent" if the element is sufficiently transparent in the visible electromagnetic spectral range. In one embodiment, the back contact transparent conductive material layer 9 can include a transparent conductive oxide such as, but not limited to, a fluorine-doped tin oxide ($SnO_2$:F), an aluminum-doped zinc oxide (ZnO:Al), tin oxide (SnO) and indium tin oxide ($InSnO_2$, or ITO for short). The thickness of the back contact transparent conductive material layer 9 may vary depending on the type of transparent conductive material employed, as well as the technique that was used in forming the transparent conductive material. Typically, and in one embodiment, the thickness of the back contact transparent conductive material layer 9 ranges from 20 nm to 500 nm. Other thicknesses, including those less than 20 nm and/or greater than 500 nm can also be employed. The optimum thickness of TCO for minimizing reflection from the surface of Si is in the range of 70 nm to 110 nm. The back contact transparent conductive material layer 9 is typically formed using a deposition process, such as sputtering or CVD. Examples of CVD processes suitable for forming the back contact transparent conductive material layer 9 include, but are not limited to, APCVD, LPCVD, PECVD, MOCVD and combinations thereof. Examples of sputtering include, but are not limited to, RF and DC magnetron sputtering. In some embodiments, a metal layer may be used instead of the transparent conductive material layer 9. The metal may be selected from the group including titanium (Ti), aluminum (Al), copper (Cu), tungsten (Tu), plantium (Pt), silver (Ag), chromium (Cr), and combinations thereof. The metal layer may be deposited using a physical vapor deposition (PVD) method, such as thermal or electron-beam evaporation, plating or sputtering. The metal layer may be also formed using screen-printing.

Still referring to FIGS. 1A and 1B, a substrate 12 may be present underlying the back contact structure. In one embodiment, the substrate 12 may be composed of a semiconductor material, such as a silicon-containing semiconductor material. Examples of silicon-containing semiconductor materials include silicon (Si), germanium (Ge), silicon germanium (SiGe), silicon carbide (SiC), silicon germanium carbide (SiGeC) and combinations thereof. In one embodiment, the substrate 12 is composed of a glass or a polymeric material.

Referring to FIGS. 1A and 1B and, in one embodiment, the bottom cell 25 of the photovoltaic device 100 is separated from the upper cell 35 of the photovoltaic device 100 by a tunneling layer 30. The tunneling layer 30 may be composed of a metal layer or a transparent conductivity material. In one embodiment, the tunneling layer 30 may be composed of a transparent conductive material, such as the transparent conductive oxide (TCO). The role of the optional tunneling layer is to enhance the tunneling of the carriers at the $p^+/n^+$ tunneling junction formed at the interface between the top cell and the bottom cell. In one embodiment, the tunneling layer 301 may have a thickness ranging from 5 nm to 15 nm, although larger and lesser thicknesses may be also used. The thickness of the tunneling layer is typically adjusted to optimize the tunneling of carriers, as well as the optical coupling between the top cell and the bottom cell. In one embodiment, the upper cell 35 is a p-i-n amorphous silicon (α-Si) cell. The materials of the layers within the upper cell 35 are selected to absorb shorter wavelengths of light, whereas the materials of the layers within the bottom cell 25 are selected to absorb longer wavelengths of light. When the photovoltaic device 100 is in operation, the light from the light source, such as the sun, travels through upper top cell 35 first before reaching the bottom cell 25. In one example, the top layer 15 is p-type hydrogenated amorphous silicon ($p^+$ α-Si:H), the middle layer 14 is intrinsic hydrogenated amorphous silicon (i α-Si:H), and the bottom layer 13 is n-type hydrogenated amorphous silicon ($n^+$ α-Si:H). In another example, the top layer 15 is p-type hydrogenated amorphous silicon carbide ($p^+$ α-SiC:H), the middle layer 14 is intrinsic hydrogenated amorphous silicon (i α-Si:H), and the bottom layer 13 is n-type hydrogenated amorphous silicon ($n^+$ α-Si:H). It is noted that the above compositions for the material layers of the top cell 35 are provided for illustrative purposes only. For example, the crystalline structure for each material layer does not necessarily have to be amorphous. In some examples, the crystalline structure for the top layer 15, the middle layer 14 and the bottom layer 13 may be single crystal, polycrystalline, multi-crystalline, microcrystalline and/or nanocrystalline. Each of the top layer 15, middle layer 14 and the bottom layer 13 of the top cell 35 may be deposited using a chemical vapor deposition (CVD) process. Examples of chemical vapor deposition (CVD) methods that are suitable for forming the material layers of the upper cell 35 include, but are not limited to, Atmospheric Pressure CVD (APCVD), Low Pressure CVD (LPCVD) and Plasma Enhanced CVD (EPCVD), and combinations thereof may also be employed. The material layers of the upper cell 35 may also be deposited using evaporation, chemical solution deposition, spin on deposition, and physical vapor deposition (PVD) methods. In some embodiments, each of the top layer 15, middle layer 14 and the bottom layer 13 of the upper cell 35 may be deposited using the low temperature plasma enhanced chemical vapor deposition method that is described above for forming the silicon (Si) containing layer 5. Typically, each of the top layer 15, middle layer 14 and the bottom layer 13 of the upper cell 35 has a thickness from 1 nm to 1 mm, with a thickness from 2 nm to 5 µm being more typical.

Still referring to FIGS. 1A and 1B and, in some embodiments, a front transparent conductive material layer 16 is present on the upper surface of the top layer 15 of the upper cell 35. The front transparent conductive material layer 16 is composed of a similar material as the back contact transparent conductive material layer 9. The front transparent conductive material layer 16 of this embodiment can also be formed utilizing one of the techniques mentioned above for the front transparent conductive material layer 16.

Referring to FIG. 1C and, in one embodiment, a photovoltaic device 100' is provided in which three upper cells 35a, 35b, 35c may be present over the bottom cell 25, in which each of the upper cells 35a, 35b, 35c are separated from each other and the bottom cell 25 by a tunneling layer 30, 30a, 30b. The bottom cell 25 that is depicted in FIG. 1C is similar to the bottom cell 25 that is depicted in FIGS. 1A and 1B. Therefore, the description of the bottom cell 25 that is depicted in FIGS. 1A and 1B is suitable for the bottom cell 25 that is depicted in FIG. 1C. The tunneling layer 30a, 30b that is present between each of the upper cells 35a, 35b, 35c is similar to the tunneling layer 30 that is described above with reference to FIG. 1B. Therefore, the above description of the tunneling layer 30 that is depicted in FIGS. 1A and 1B is suitable for the tunneling layer 30 that is depicted in FIG. 1C.

Each of the upper cells 35a, 35b, 35c of the photovoltaic device 100 that is depicted in FIG. 1C may be a multi-layered structure including an upper layer of a p-type conductivity semiconductor, a middle layer composed of an intrinsic semiconductor and a lower layer of an n-type conductivity semiconductor. Typically, the materials of the upper cells 35a, 35b, 35c are selected so that the cells that are closest to the light source absorb the shorter wavelengths and the cells that are farther away from the light source absorb the longer wavelengths. The semiconductor material layers may have an amorphous or crystalline crystal structure. In some examples, when the semiconductor material has a crystalline crystal structure, the semiconductor material may be monocrystalline, polycrystalline, multi-crystalline, micro-crystalline, nano-crystalline or a combination thereof. The n-type or p-type conductivity may be provided by in-situ doping or ion implantation.

In one example, the uppermost upper cell 35c of the photovoltaic device 100 is composed of p-type hydrogenated amorphous silicon layer (p-type α-Si:H) that is present on an intrinsic hydrogenated amorphous silicon layer (i α-Si:H), which is present on an n-type hydrogenated amorphous silicon layer (n-type α-Si:H). The p-type hydrogenated amorphous silicon layer (p-type α-Si:H) of the uppermost upper cell 35c is closest to the light source and the n-type hydrogenated amorphous silicon layer (n-type α-Si:H) is in contact with the tunneling layer 30b that is present between the uppermost upper cell 35c and a middle upper cell 35b. In one example, the middle upper cell 35b is composed of the photovoltaic device 100 is composed of p-type hydrogenated amorphous silicon germanium layer (p-type α-SiGe:H) that is present on an intrinsic hydrogenated amorphous silicon germanium layer (i α-SiGe:H), which is present on an n-type hydrogenated amorphous silicon germanium layer (n-type α-SiGe:H). The p-type hydrogenated amorphous silicon germanium layer (p-type α-Si:H) of the middle upper cell 35b is in contact with the tunneling layer 30b that is separating the uppermost upper cell 35c from the middle upper cell 35b. The n-type hydrogenated amorphous silicon germanium layer (n-type α-Si:H) of the middle upper cell 35b is in contact with the tunneling layer 30a that is separating the middle upper cell 35b from the lower upper cell 35a. In one example, the lower upper cell 35a is composed of p-type hydrogenated microcrystalline silicon (p-type µc-Si:H) layer that is present on an intrinsic hydrogenated microcrystalline silicon (i µc-Si:H) layer, in which the intrinsic hydrogenated microcrystalline silicon (i µc-Si:H) layer is present on an n-type hydrogenated microcrystalline silicon (n-type µc-Si:H) layer. The p-type hydrogenated microcrystalline silicon (p-type µc-Si:H) layer may be in direct contact with the tunneling layer 30a that separates the middle upper cell 35b from the lower upper cell 35a. The n-type hydrogenated microcrystalline silicon (p-type µc-Si:H) layer may be in direct contact with the tunneling layer 30 that separates the middle upper cell 35b from the lower upper cell 35a.

Each of the material layers within the upper cells 35a, 35b, 35c of the photovoltaic device 100' may have a thickness ranging from 1 nm to 1 mm. In another embodiment, each of the material layers within the upper cells 35a, 35b, 35c of the photovoltaic device 100' may have a thickness ranging from 2 nm to 5 µm. Each of the material layers within the upper cells 35a, 35b, 35c of the photovoltaic device 100 may be deposited using a chemical vapor deposition (CVD) process. The intrinsic semiconductor back contact layer 7 may also be deposited using evaporation, chemical solution deposition, spin on deposition, and physical vapor deposition (PVD) methods. In some embodiments, each of the material layers within the upper cells 35a, 35b, 35c of the photovoltaic device 100' may be deposited using the low temperature plasma enhanced chemical vapor deposition method that is described above for forming the silicon (Si) containing layer 5.

Still referring to FIG. 1C, an upper cell transparent conductive material layer 16', may be present on the upper surface of the uppermost cell 35c. The upper cell transparent conductive material layer 16' may be composed of the same material as the front transparent conductive material layer 16 that is depicted in FIGS. 1A and 1B. Therefore, the above description of the front transparent conductive material layer 16 that is depicted in FIGS. 1A and 1B is suitable for the upper cell transparent conductive material layer 16' that is depicted in FIG. 1C.

FIGS. 2A-2B depict another embodiment of the present disclosure. In FIGS. 2A-2B, a photovoltaic device 100" is provided that includes an upper cell 130 including a cadmium telluride (CdTe) cell that absorbs a first range of wavelengths of light and a bottom cell 125 that absorbs a second range of wavelengths of light, wherein the bottom cell 130 includes a heterojunction having a crystalline germanium (Ge) containing layer 111. In one embodiment, the bandgap of the CdTe top cell is in the range of 1.3-1.6 eV. In another embodiment, the bandgap of the CdTe top cell is in the range of 1.4-1.5 eV. In one embodiment, the Ge containing bottom cell is comprised of crystalline silicon-germanium with a bandgap in the range of 0.67-0.85 eV. In another embodiment, the Ge containing bottom cell is comprised of pure crystalline Ge having a bandgap of 0.67 eV.

The lower cell 125 of the photovoltaic device 100" depicted in FIGS. 2A and 2B is similar to the lower cell 25 of the photovoltaic device 100 that is depicted in FIGS. 1A and 1B. The crystalline germanium (Ge) containing layer 111 that is depicted in FIGS. 2A and 2B is similar to the crystalline germanium (Ge) containing nanowire 11 that is depicted in FIGS. 1A and 1B. Therefore, the description of the crystalline germanium (Ge) containing nanowire 11 that is depicted in FIGS. 1A and 1B is suitable for the crystalline germanium (Ge) containing nanowire 11 that is depicted in FIGS. 2A and 2B. In one example, the crystalline germanium (Ge) nanowire 11 is composed of crystalline germanium (Ge) having a p-type conductivity.

The lower cell 125 further includes a silicon (Si) containing layer 60 overlying the crystalline germanium (Ge) containing layer 111, wherein the silicon containing layer 60 has a conductivity type that is opposite the crystalline germanium (Ge) containing layer 111. For example, when the crystalline germanium (Ge) containing layer 111 has a p-type conductivity, the silicon (Si) containing layer 60 has an n-type conductivity. The silicon (Si) containing layer 60 that is depicted in FIGS. 2A and 2B is similar to the silicon (Si) containing layer 5 that is depicted in FIGS. 1A and 1B. In one example, in which the crystalline germanium (Ge) containing layer 111 is composed of p-type germanium (Ge), the silicon (Si) containing layer 60 is composed of n-type hydrogenated amorphous silicon carbide ($n^+$ α-SiC:H).

Referring to FIGS. 2A and 2B, in one embodiment, the silicon (Si) containing layer 60 is separated from the crystalline germanium (Ge) containing layer 11 by a front intrinsic semiconductor contact layer 50. In one example, when the crystalline germanium (Ge) containing nanowires 111 are composed of p-type germanium (Ge) having a single crystal crystalline structure and the silicon containing layer 60 is composed of n-type hydrogenated amorphous silicon carbide ($n^+$ α-SiC:H), the front intrinsic semiconductor contact layer 50 may be composed of intrinsic hydrogenated amorphous silicon carbide (i α-SiC:H).

The silicon (Si) containing layer 60 and the front intrinsic semiconductor contact layer 50 provide the emitter contact to the absorption layer of the lower cell 125 that is provided by the crystalline germanium (Ge) containing layer 111. The back contact to the crystalline germanium (Ge) containing nanowire 111 may be provide by a p-type crystalline silicon germanium (SiGe) layer 70 that is in direct contact with the back surface of the crystalline germanium (Ge) containing nanowire 111. The concentration of the p-type dopant in the p-type crystalline silicon germanium (SiGe) layer 70 is typically greater than the p-type dopant in the p-type crystalline silicon germanium (SiGe) layer 70. In some embodiments, a p-type hydrogenated amorphous silicon germanium (α-SiGe:H) layer 80 is present in contact with the surface of the p-type crystalline silicon germanium (SiGe) layer 70 that is opposite the surface of the p-type crystalline silicon germanium (SiGe) layer 70 that is in contact with the back surface of the crystalline germanium (Ge) containing nanowire 111. The lower cell 125 may also include a substrate 120 and a transparent conductive oxide layer 90. The description of the substrate 12 depicted in FIGS. 1A and 1B is suitable for the substrate 120 that is depicted in FIGS. 2A and 2B. The description of the transparent conductive oxide layer 9 depicted in FIGS. 1A and 1B is suitable for the transparent conductive oxide layer 90 that is depicted in FIGS. 2A and 2B.

The lower cell 125 is separated from the upper cell 130 by a tunneling layer 300. The upper cell 130 includes a first conductivity, i.e., p-type or n-type, buffer region 305 that is in direct contact with the tunneling layer 300. The buffer layer may serve to provide/improve ohmic contact between the tunneling layer 300 and the first conductivity type layer 306. In some embodiments, a first conductivity, i.e., p-type or n-type, cadmium telluride (CdTe) layer 306 is present on the buffer region 305. Typically, the cadmium telluride (CdTe) layer 306 has the same conductivity, i.e., first conductivity as the buffer region 305. In some embodiments, the first conductivity type cadmium telluride (CdTe) layer 306 may be replaced with a first conductivity material layer of copper indium gallium (di)selenide (CIGS), $Cu_2ZnSnS_4$ (CZTS), or $CuzZnSnSe_4$ (CZTSe). In some embodiments, a second conductivity type cadmium sulfide (CdS) layer 307 is present on the upper surface of the first conductivity type cadmium telluride (CdTe) layer 306. The second conductivity type of the cadmium sulfide (CdS) layer 307 is opposite the first conductivity type of the cadmium telluride (CdTe) layer 306. For example, when the first conductivity type of the cadmium telluride (CdTe) layer 306 is p-type, the second conductivity type of the cadmium sulfide (CdS) layer 307 is n-type. Each of the buffer region 305, the first conductivity cadmium telluride (CdTe) layer 306, and the second conductivity cadmium sulfide (CdS) layer 307 may be deposited using a chemical vapor deposition (CVD) process. Examples of chemical vapor deposition (CVD) methods that are suitable for forming of the material layers within the upper cell 130 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed.

Still referring to FIGS. 2A and 2B, in one embodiment a front transparent conductive material layer 308 is present on an upper surface of the second conductivity type cadmium sulfide (CdS) layer 307. The front transparent conductive material layer 308 that is depicted in FIGS. 2A and 2B is similar to the front transparent conductive material layer 16 that is described above with reference to FIGS. 1A and 1B. Therefore, the description of the front transparent conductive material layer 16 that is depicted in FIGS. 1A and 1B is suitable for the front transparent conductive material layer 308 that is depicted in FIGS. 2A and 2B.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A method of forming a photovoltaic device comprising:
   forming a first cell comprising a crystalline germanium (Ge) containing layer, in which at least one surface of the crystalline germanium (Ge) containing layer is in contact with a silicon (Si) containing layer having a larger band gap than the crystalline germanium (Ge) containing layer, wherein the crystalline germanium (Ge) containing layer comprises a first portion comprising a nanowire and a second portion, wherein the nanowire has a length that extends vertically upward from, and perpendicular to, a horizontal surface of said second portion, and wherein said silicon (Si) containing layer is in direct contact with an entire outermost surface of the nanowire; and
   forming at least one second cell on the first cell, wherein the at least one second cell is positioned so that a light source enters the at least one second cell before reaching the first cell.

2. The method of claim 1, wherein the nanowire is formed by etching a germanium (Ge) containing material in the first cell.

3. The method of claim 2, wherein the nanowire has a stepped surface.

4. The method of claim 3, wherein the silicon (Si) containing layer is epitaxially formed directly on the nanowire.

5. The method of claim 3, wherein the silicon (Si) containing layer has a conformal thickness.

6. The method of claim 1, further comprising doping the crystalline germanium (Ge) containing layer to provide a first conductivity type of a p-type or n-type dopant, and doping the silicon (Si) containing layer to provide a second conductivity type of an n-type or p-type dopant that is opposite the first conductivity type.

7. The method of claim 6, wherein the crystalline germanium (Ge) containing has a uniform dopant concentration.

8. The method of claim 6, wherein the crystalline germanium (Ge) containing has a graded dopant concentration.

9. The method of claim 1, wherein the nanowire is composed of silicon germanium (SiGe).

10. The method of claim 9, wherein silicon (Si) content in the nanowire is less than the silicon (Si) content of the silicon (Si) containing layer.

11. The method of claim 1, wherein the germanium (Ge) content of the crystalline germanium (Ge) containing layer is greater than the germanium (Ge) content of the silicon (Si) containing layer.

12. The method of claim 1, wherein the silicon (Si) containing layer is formed using a plasma-enhanced chemical vapor deposition (PECVD) method at temperatures below 400° C.

13. The method of claim 1, wherein the at least one second cell is formed by a deposition process and comprises a single cell structure that is comprised of a p-i-n solar cell comprised of amorphous hydrogenated silicon (Si) or a multi-cell structure that comprises a first p-i-n solar cell comprised of hydrogenated microcrystalline silicon (Si), a second p-i-n solar cell comprised of hydrogenated amorphous silicon germanium (Site), and a third p-i-n solar cell comprised of hydrogenated amorphous silicon (Si).

14. The method of claim 1, wherein the crystalline germanium (Ge) containing layer of the first cell is germanium (Ge), and the silicon (Si) containing layer is doped silicon (Si), wherein the silicon (Si) containing layer is separated from the germanium (Ge) containing layer by an intrinsic silicon (Si) containing layer.

15. The method of claim 1, wherein the at least one second cell is formed by a deposition process and the at least one second cell is a multilayered structure.

16. The method of claim 15, wherein the layers of the at least one second cell are material layers selected from the group consisting of cadmium telluride (CdTe), cadmium sulfur (CdS), copper indium gallium (di)selenide (CIGS), $Cu_2ZnSnS_4$ (CZTS), $Cu_2ZnSnSe_4$ (CZTSe) and a combination thereof.

17. The method of claim 1, wherein the crystalline germanium (Ge) containing layer has a band gap from 0.67 eV to 0.80 eV.

* * * * *